(12) United States Patent
Muchow et al.

(10) Patent No.: US 6,204,086 B1
(45) Date of Patent: *Mar. 20, 2001

(54) METHOD FOR MANUFACTURING SEMICONDUCTOR COMPONENTS HAVING MICROMECHANICAL STRUCTURES

(75) Inventors: Joerg Muchow, Reutlingen; Helmut Baumann, Gomaringen, both of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,777

(22) Filed: Mar. 11, 1998

(30) Foreign Application Priority Data

Mar. 13, 1997 (DE) .................................. 197 10 324

(51) Int. Cl.⁷ .............................. H01L 21/00; G01L 9/06
(52) U.S. Cl. ...................................... 438/53; 73/721
(58) Field of Search ........................ 216/2, 33; 438/50, 438/51, 52, 53; 73/721

(56) References Cited

U.S. PATENT DOCUMENTS

| | | | |
|---|---|---|---|
| 4,766,666 | * | 8/1988 | Sugiyama et al. ............. 73/721 |
| 5,188,983 | * | 2/1993 | Guckel et al. .................. 438/53 |
| 5,242,863 | * | 9/1993 | Xiang-zheng et al. .......... 438/53 |
| 5,736,430 | * | 4/1998 | Seefeldt et al. ................ 438/53 |
| 5,801,069 | * | 9/1998 | Harada et al. ................. 438/53 |
| 5,883,420 | * | 3/1999 | Mirza et al. ................... 438/53 |
| 5,920,106 | * | 7/1999 | Oba et al. ..................... 438/53 |

* cited by examiner

*Primary Examiner*—Nam Nguyen
*Assistant Examiner*—Gregg Cantelmo
(74) *Attorney, Agent, or Firm*—Kenyon & Kenyon

(57) ABSTRACT

A method for manufacturing semiconductor components having micromechanical structures, micromechanical structures being patterned in a wafer for detecting a physical quantity acting on micromechanical structures, and semiconductor components for converting the physical quantity into an electrical signal proportional to the physical quantity being produced. The semiconductor components and the micromechanical structures are defined in a self-aligning manner by process steps acting on one side of the wafer to produce semiconductor components.

2 Claims, 5 Drawing Sheets

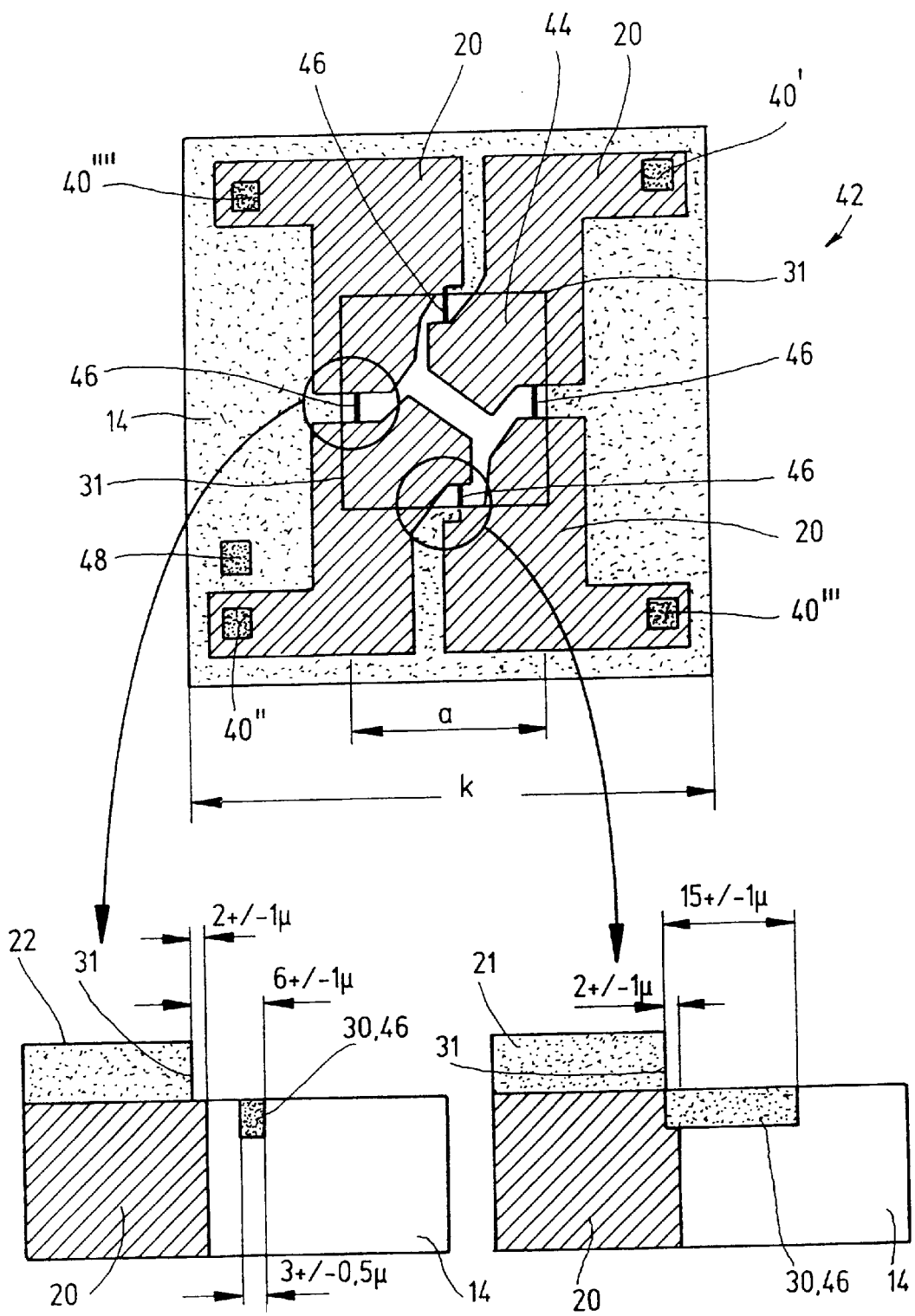

METHOD FOR MANUFACTURING SEMICONDUCTOR COMPONENTS HAVING MICROMECHANICAL STRUCTURES

BACKGROUND INFORMATION

It is generally known to combine semiconductor components with micromechanical structures. The result is compact components, which are able to detect an acting physical quantity, such as a pressure, and simultaneously produce an electrical signal proportional to this physical quantity that is then fed to an evaluation circuit of the component. Components of this kind are manufactured, as is generally known, as monolithic components, the sensor part and the evaluation part being produced one after another in a wafer. The inherent drawback here is that because of the different fabrication techniques, significant interventions in each of the other fabrication steps have to be made.

Furthermore, it is known to manufacture the sensor part and the evaluation part separately and to subsequently join them to the component. The sensor part has the micromechanical structures and the semiconductor components for detecting an electrical signal that is proportional to the physical quantity. In the case of a pressure sensor, a membrane that deforms under applied pressure is produced in a silicon wafer. This deformation is taken up by piezoresistors (semiconductor components), which as a result undergo an analog change in resistance. This altered resistance is detected with a later applied evaluation circuit and used to obtain a pressure-proportional output signal.

It is known to fabricate the silicon membrane using an anisotropic etching process. The piezoresistors for detecting membrane deflection are then assigned to this silicon membrane through process steps in the semiconductor component production. The drawback here is that because of the separate processes, the distance between the piezoresistors and the membrane at maximum stress can only be realized with a relatively large deviation of about 50 $\mu$m.

SUMMARY OF THE INVENTION

The method of the present invention has the advantage that the piezoresistors are able to be placed with a much greater accuracy at the point of the membrane's maximum stress. This makes it possible to substantially reduce the size of the sensor part, so that given the same patterning on a wafer of the same size as those of the related art, the number of attainable components can be increased. Besides a higher yield, one derives the benefit here of reduced costs.

Due to the fact that the semiconductor components and the micromechanical structures are defined in a self-aligning manner by process steps acting on one side of the wafer to produce semiconductor components, both the micromechanical structure and the semiconductor components can be defined in the narrowest of spaces by simple process steps to be mastered with a high level of precision, since it is possible using the masking technique of semiconductor fabrication to achieve a very high accuracy, within the range of a few $\mu$m. The regions are defined relative to one another with self-alignment, producing by this means the mechanical structures and the semiconductor components.

The semiconductor components featuring the micromechanical structures are preferably able to be produced in successive process steps using a plurality of masking levels, the process steps being carried out from merely one side of the wafer. Besides the fact that this is easily feasible in terms of process engineering, a multiplicity of variants can be achieved with relatively little outlay for development.

Moreover, it is advantageous that when the micromechanical structures are defined with the aid of the semiconductor component production method, the hollow space needed for membrane deflection is enclosed within the component. This simplifies the subsequent mounting of chips containing the evaluation circuit, since the connection between the evaluation circuit and the sensor element no longer needs to be designed compactly. Thus, for example, in the place of costly soldering, the chips containing the evaluation circuit can be bonded (adhesively applied) to the sensor element.

BRIEF DESCRIPTION OF THE DRAWINGS

FIG. 13 shows a layout of a pressure sensor.

FIG. 13a shows a detailed view of a first portion of the pressure sensor shown in FIG. 13.

FIG. 13b shows a detailed view of a second portion of the pressure sensor shown in FIG. 13.

DETAILED DESCRIPTION

Figure 1:
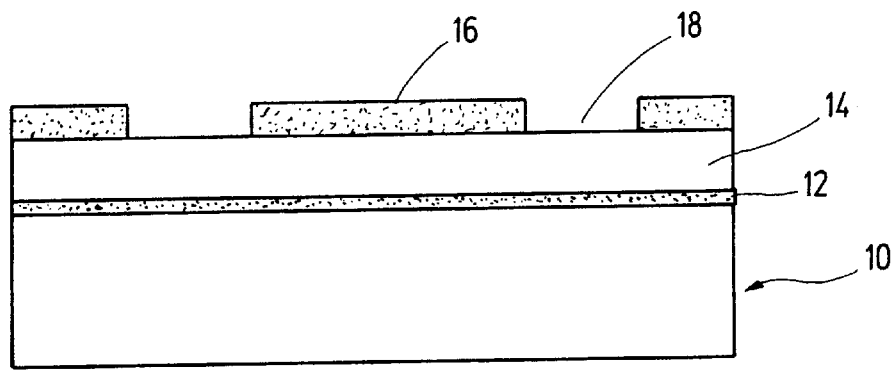
FIG. 1 illustrates a first process step for producing the semiconductor component featuring the micromechanical structures of the present invention.

First, the method for fabricating semiconductor components featuring micromechanical structures will be explained on the basis of FIGS. 1 through 10. A wafer 10 is shown schematically in a cutaway view in each of the Figures.

On the basis of the exemplary embodiment, the intention here is to disclose the manufacturing of a pressure sensor, which comprises a membrane that is movably arranged over a hollow space, and piezoresistors assigned to the membrane, for detecting the membrane's deflection. By way of an evaluation circuit, this pressure sensor is connected to a sensor element.

Wafer 10 is an SOI (silicon-on-insulator) wafer having a <100>crystal orientation. Above an introduced oxide layer 12, wafer 10 has an n-doped zone 14. Applied to n-doped zone 14 is a thermal oxide 16, into which windows 18 are etched via a masking (not shown). Situated in the area of windows 18 is n-doped zone 14, upwardly exposed in accordance with the illustration of FIG. 1.

Figure 2:
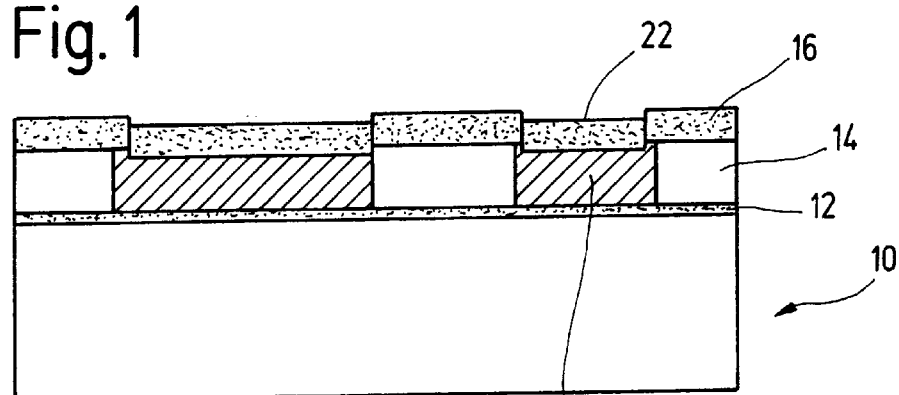
FIG. 2 illustrates a second process step for producing the semiconductor component featuring the micromechanical structures of the present invention.

In a next process step elucidated on the basis of FIG. 2, a $p^+$-diffusion 20 is produced through windows 18 in n-doped zone 14. During formation of the $p^+$-diffusion, a thermal oxide 22 grows into windows 18, so that $p^+$-zones 20 are delimited within n-doped zone 14 from oxide 12, i.e., oxide 22. $P^+$-zone 20 constitutes the later connection region for the piezoresistors.

Figure 3:
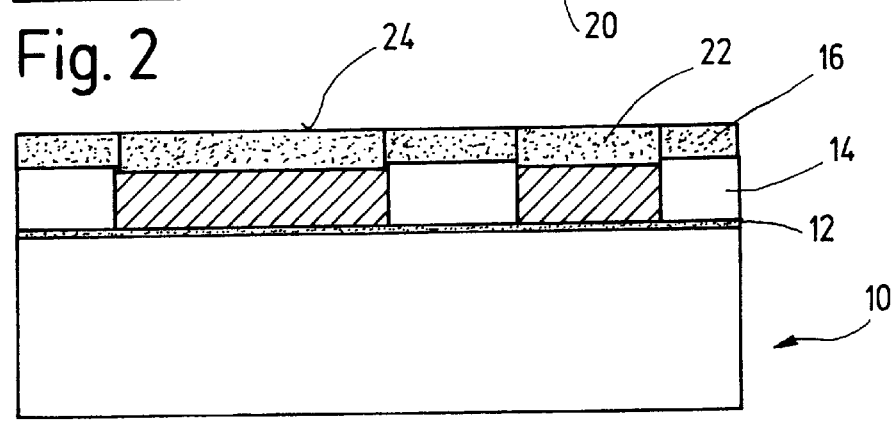
FIG. 3 illustrates a third process step for producing the semiconductor component featuring the micromechanical structures of the present invention.
Figure 4:
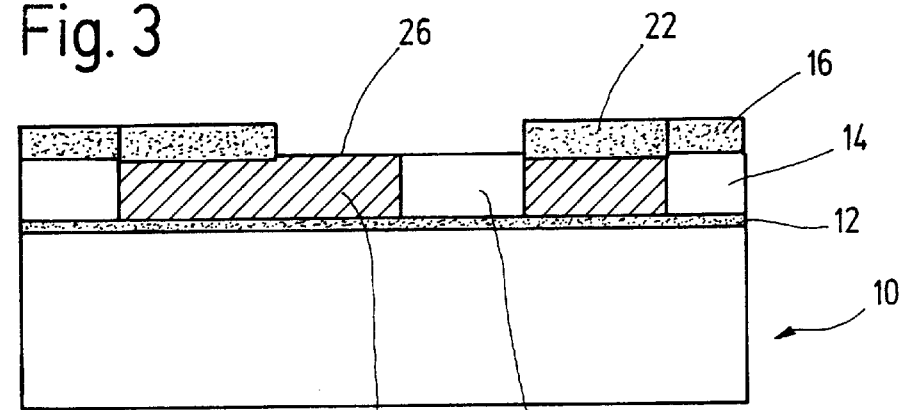
FIG. 4 illustrates a fourth process step for producing the semiconductor component featuring the micromechanical structures of the present invention.

In accordance with the process step shown in FIG. 3, surface 24 is planarized, so that the various levels of thermal oxide 16, i.e., of thermal oxide 22 are evened out. A CMP polish, for example, can be used for the planarization process. As FIG. 4 shows, a window 26 is opened into planarized oxide layer 16, 22, e.g., by means of an etching process. Window 26 is situated in this case partially over a $p^+$-doped zone and a region of n-doped zone 14. The size of the later membrane is defined by window 26.

Figure 5:
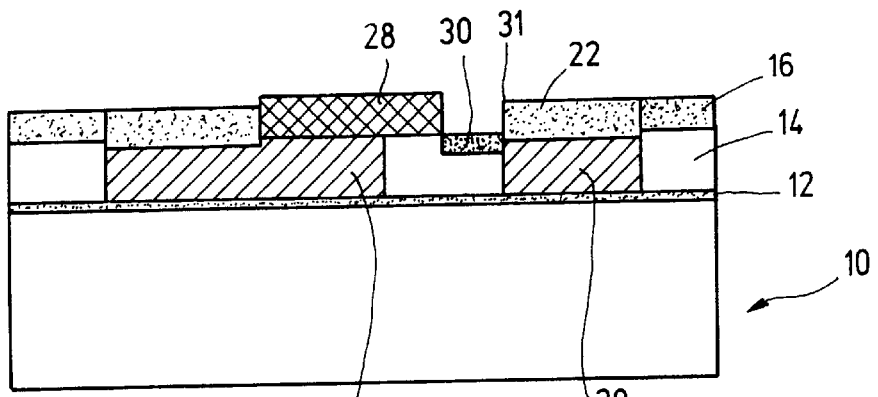
FIG. 5 illustrates a fifth process step for producing the semiconductor component featuring the micromechanical structures of the present invention.
Figure 6:
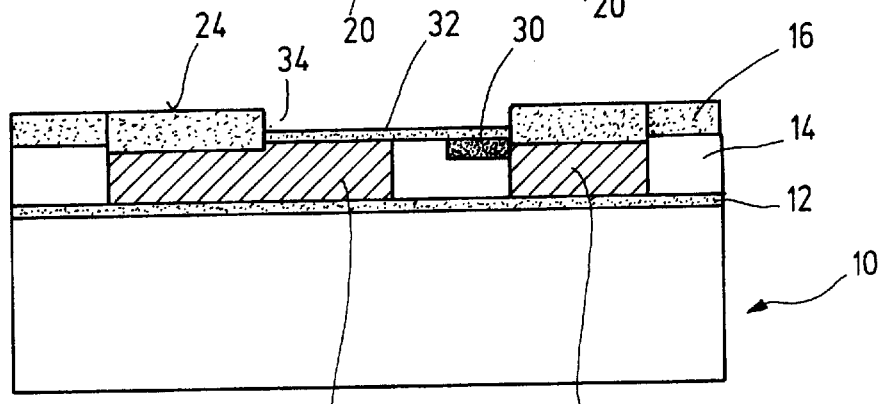
FIG. 6 illustrates a sixth process step for producing the semiconductor component featuring the micromechanical structures of the present invention.

As depicted by FIG. 5, a mask 28 used to introduce a $p^-$-diffusion 30 is subsequently applied. By this means, a $p^-$-zone 30 is created within the region of n-doped zone 14 surrounded by $p^+$-zone 20. Due to the fact that $p^-$-zone 30 is delimited on both sides by $p^+$-zones 20 (as becomes clear from the top view in FIG. 13),—given suitable patterning of $p^+$-zones 20 —, the later piezoresistors formed by $p^-$-zones 30 are automatically equal in size.

By means of masking 28, $p^-$-doped zone 30 is placed in the immediate vicinity of an edge 31 of oxide 22, which forms an edge (still to be explained) of a membrane where a maximum stress occurs upon deflection of the membrane. Edge 31 is used at the same time as masking for introducing $p^-$-doped zone 30.

A thin layer of thermal oxide 32 is then grown within window 26. This layer of thermal oxide 32 is thinner than the planarized layer of oxide 16, i.e., 22, so that a depression 34 that opens toward surface 24 results. This depression 34 constitutes the later cavity for the pressure sensor, this cavity likewise being denoted by 34 and covered by the membrane.

Figure 7:
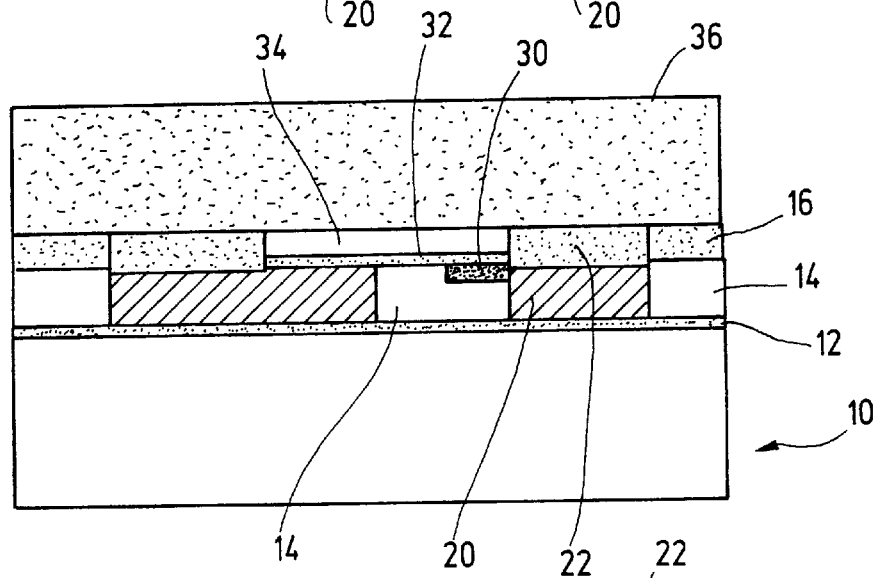
FIG. 7 illustrates a seventh process step for producing the semiconductor component featuring the micromechanical structures of the present invention.

As illustrated by FIG. 7, a substrate plate 36, which, for example, can be a thin glass plate or a silicon wafer, is applied to surface 24. Substrate plate 36 can be bonded anodically or directly to oxide 16, i.e., 22. This results within the component shown in FIG. 7 in a cavity 34 formed by the depression, this cavity 34 being delimited —in accordance with the view shown in FIG. 7—to the top by substrate plate 36 and to the bottom by a series of layers of oxide 32, of oxide 12, and regions of n-doped zone 14 situated between oxides 12 and 32, of $p^+$-doped zone 20, and of $p^-$-doped zone 30—which form the later membrane.

Figure 8:
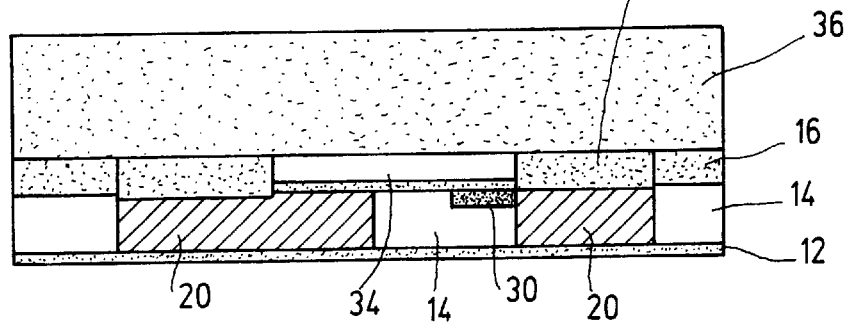
FIG. 8 illustrates an eighth process step for producing the semiconductor component featuring the micromechanical structures of the present invention.
Figure 9:
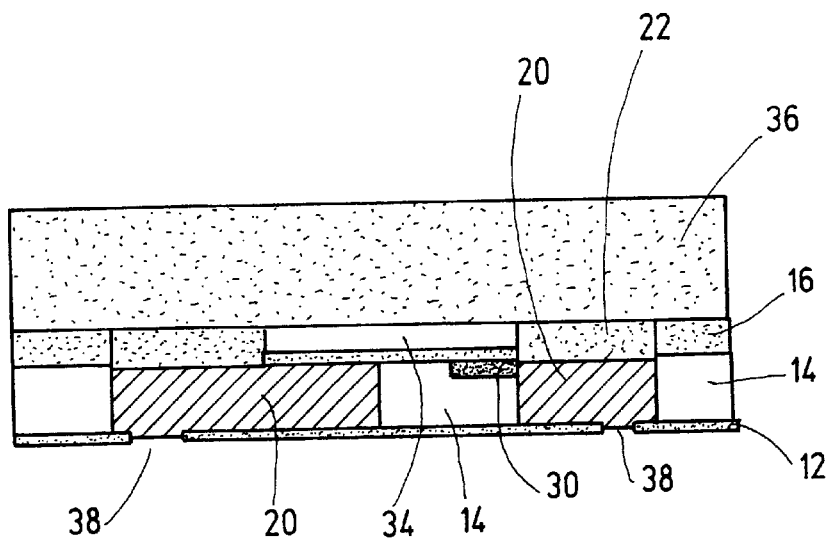
FIG. 9 illustrates a ninth process step for producing the semiconductor component featuring the micromechanical structures of the present invention.

As shown in FIG. 8, the silicon of wafer 10 is ablated to oxide layer 12. This can be done, e.g., by means of abrasive trimming and/or through an overetching step. Vias (through-holes) (38), through which $p^+$-zones 20 are accessible (FIG. 9), are produced, e.g., etched into oxide layer 12, in conformance with the layout selected for the pressure sensor. A contacting point 40 (FIG. 10) for $p^+$-zones 20 is formed above via 38.

Thus, by means of the process steps elucidated on the basis of FIGS. 1 through 10, micromechanical structures, in this case the membrane covering cavity 34 and suitably doped regions are able to be patterned as semiconductor components to produce the piezoresistors. Depending on the masking and doping selected, semiconductor components featuring various micromechanical structures are able to be fabricated, a defined positioning of the semiconductor components relative to the micromechanical structures being possible in a self-alignment process.

The design of a practical pressure sensor 42 shall be elucidated in the following on the basis of FIGS. 12, 13, 13a and 13b, the structures shown therein being produced by means of the process steps in accordance with FIGS. 1 through 10.

Figure 10:
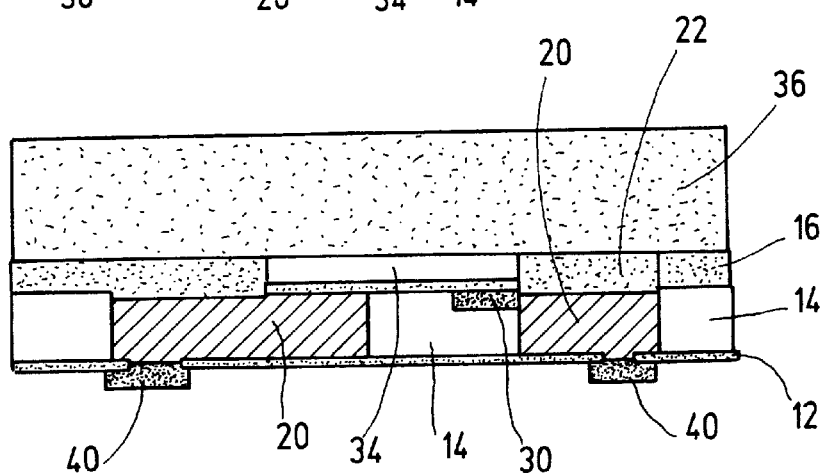
FIG. 10 illustrates a tenth process step for producing the semiconductor component featuring the micromechanical structures of the present invention.
Figure 11:
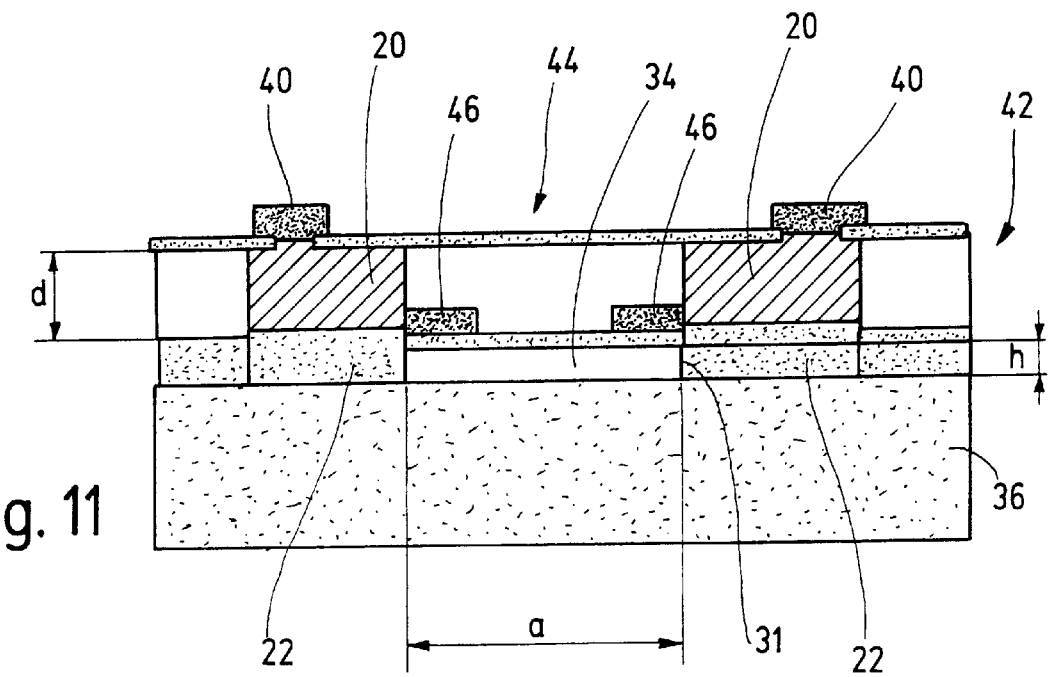
FIG. 11 shows a sectional view through a practical specific embodiment of a pressure sensor.

FIG. 11 shows a pressure sensor in a schematic sectional view, the illustration being rotated by 180° with respect to FIG. 10. Parts equivalent to those in the preceding Figures are given the same reference numerals.

Pressure sensor 42 has a membrane 44 which extends over cavity 34. Cavity 34 is delimited to the top and bottom by membrane 44 and substrate plate 36, and laterally by edge 31 of oxide 22. Cavity 34 is completely enclosed in pressure sensor 42. Piezoresistors 46 formed by $p^-$-doped zones 30, which as generally known change their resistance value in response to a deflection of membrane 44, are disposed within membrane 44. By way of $p^+$-doped zones 20, piezoresistors 46 are electroconductively connected to contacting points 40, so that when an electrical voltage is applied, a change in the resistance value of piezoresistors 46 can be detected. This change in the resistance value follows in proportion to a deflection of membrane 44, to the inside given an externally applied pressure above atmosphere and upwards given an externally applied low pressure (partial vacuum), so that inferences can be made about the pressure effecting the membrane's deflection by evaluating the change in resistance. The evaluation circuit that completes the sensor element is not shown in detail here; however the evaluation circuit can be suitably completed with pressure sensor 10.

In accordance with one practical exemplary embodiment, membrane size a=300±1 μm, membrane thickness d=7±0.5 μm, and the height h of cavity 34=1 μm.

This dimensioning can be easily achieved by adapting the process steps described on the basis of FIGS. 1 through 10.

Figure 12:
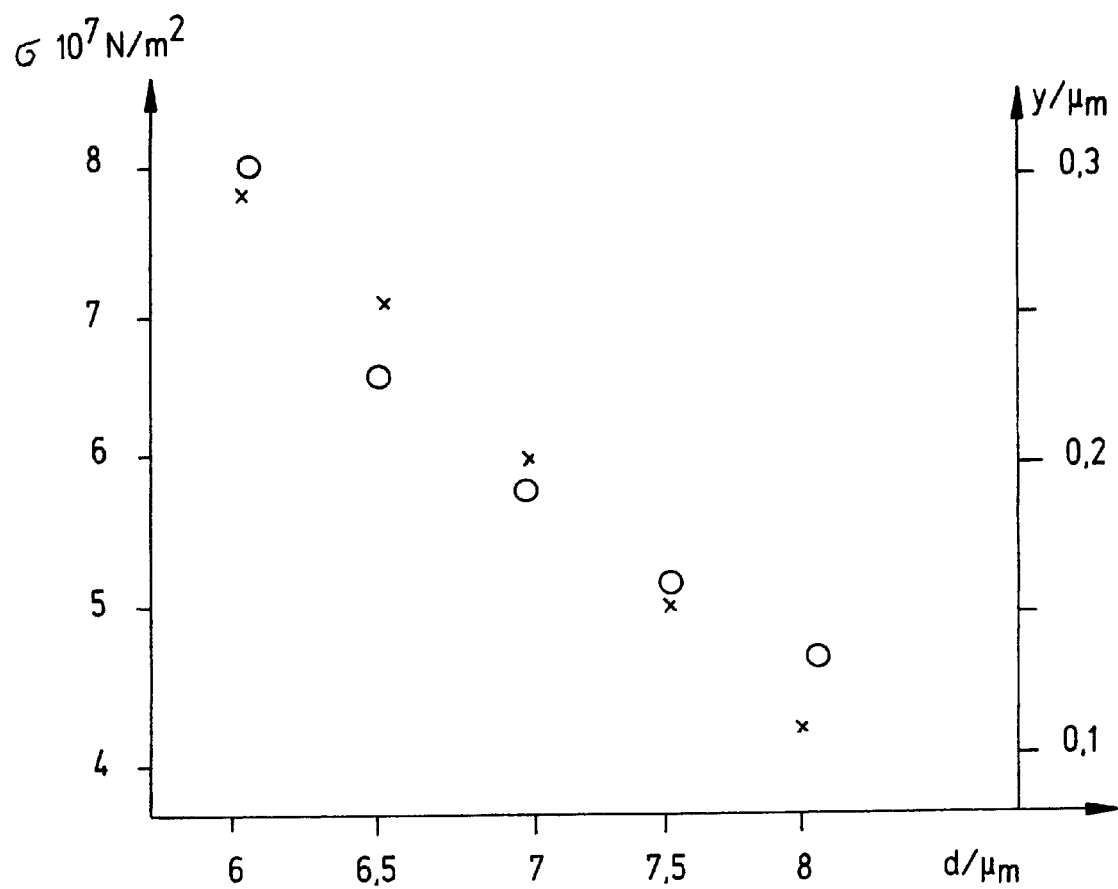
FIG. 12 shows a stress-path diagram of a pressure sensor.

In a diagram over membrane thickness d, FIG. 12 depicts stress σ of membrane 46 (left axis of coordinate), and deflection y of membrane 46 (right axis of coordinate). Stress σ is expressed by the formula:

$$\sigma = \frac{p \cdot a^2}{3.25\, d^2}.$$

Deflection y is expressed by the formula:

$$y = \frac{p \cdot a^4}{72.5\, E \cdot d^3},$$

E being the modulus of elasticity of membrane 46.

Different values are plotted in FIG. 12 for the case where pressure p equals 1 bar. Possible deflection values are characterized by ◯ and possible mechanical stress values by x. The plotted values reveal that, optimally, thickness d of membrane 46 should be 7±0.5 μm, since in this range a tolerance of responsivity (sensitivity) of ±20% is not exceeded.

FIG. 13 depicts a layout of a pressure sensor 42. The top view reveals n-doped zone 14, as well as $p^+$-doped zones 20 embedded therein. Zones 20 are each provided with a contacting 40, contacting 40' being a ground connection, contacting 40" a positive terminal, contacting 40''' and 40'''' being terminals for tapping off a change in an electrical signal resulting through piezoresistors 46 from a deflection of membrane 44. P$^+$-doped zones 20 form the conductors leading to piezoresistors 46, which are each delimited by two p$^+$-doped zones 20. All in all, p$^+$-doped zones 20 being used as conductors for piezoresistors 46 have a diagonal design, so that they are not subject to any piezo effect. It is merely piezoresistors 46, which are not diagonally aligned, that are subject to the piezo effect. N-doped zone 14 comprises an n-well terminal 48.

An edge length k of pressure sensor 42 amounts, for example, to 1 mm. The piezoresistors have a resistance value of 2 kΩ, so that the interconnection configuration shown produces a total resistance of 2 kΩ of pressure sensor 42. The bridge resistance is equal to the resistance of a single resistor. The circuit arrangement shown has pressure sensor 42 being connected in the manner of a Wheatstone bridge.

FIGS. 13a and 13b show details in accordance with FIG. 12 in a sectional representation. For the sake of clarity, the individual regions are designated by the process steps elucidated on the basis of FIGS. 1 through 10.

As can be easily inferred from FIGS. 13a and 13b, it is possible for piezoresistors 46, i.e., of p$^-$-doped zones 30 to be placed with the techniques used (see FIGS. 1 through 10) with an accuracy of up to 2±1 μm to edge 31, at the location of maximum stress upon deflection of membrane 46.

By this means, an extremely small type of construction is rendered possible for pressure sensor 42. For example, at least 10,000 pressure sensors 42 can be produced on a customary 6-inch wafer.

What is claimed is:

1. A method for manufacturing a semiconductor device, the semiconductor device including a deformable membrane and at least one piezoresistor, the at least one piezoresistor providing a measure of a deformation of the deformable membrane, the method comprising the steps of:

applying a masking layer to a silicon layer of a substrate;

forming at least one opening having at least one edge by patterning the masking layer;

introducing dopants for forming the at least one piezoresistor through the at least one opening into the silicon layer;

controlling the forming of the at least one piezoresistor in at least one direction via the at least one edge of the at least one opening;

joining the masking layer to a plate, the plate, before joining, being separate from the substrate;

forming the deformable membrane by at least removing at least a portion of the substrate; and defining at least one edge of the deformable membrane by the at least one edge of the at least one opening.

2. A method for manufacturing a pressure sensor, the pressure sensor including a deformable membrane and at least one piezoresistor, the at least one piezoresistor providing a measure of a deformation of the deformable membrane, the method comprising the steps of:

applying a masking layer to a silicon layer of a substrate;

forming at least one opening having at least one edge by patterning the masking layer;

introducing dopants for forming the at least one piezoresistor through the at least one opening into the silicon layer;

controlling the forming of the at least one piezoresistor in at least one direction via the at least one edge of the at least one opening;

joining the masking layer to a plate, the plate, before joining, being separate from the substrate;

forming the deformable membrane by at least removing at least a portion of the substrate; and defining at least one edge of the deformable membrane by the at least one edge of the at least one opening.

\* \* \* \* \*